United States Patent [19]
Buraschi

[11] Patent Number: 5,165,066
[45] Date of Patent: Nov. 17, 1992

[54] CONTACT CHAIN STRUCTURE FOR TROUBLESHOOTING EPROM MEMORY CIRCUITS

[75] Inventor: Marco I. Buraschi, Bresso, Italy

[73] Assignee: SGS-Thomson Microelectronics s.r.l., Milan, Italy

[21] Appl. No.: 782,894

[22] Filed: Oct. 22, 1991

Related U.S. Application Data

[63] Continuation of Ser. No. 454,140, Dec. 21, 1989.

[30] Foreign Application Priority Data

Dec. 29, 1988 [IT] Italy ................. 23150 A/88

[51] Int. Cl.⁵ ................... H01L 29/78; H01L 21/66
[52] U.S. Cl. .................................................. 257/48
[58] Field of Search ................ 357/51, 23.12, 23.5

[56] References Cited

U.S. PATENT DOCUMENTS

| | | | |
|---|---|---|---|
| 3,865,651 | 2/1975 | Arita | 357/23.12 |
| 4,017,888 | 4/1977 | Christie et al. | 357/23.5 |
| 4,145,701 | 3/1979 | Kawagoe | 357/23.12 |
| 4,212,025 | 7/1980 | Hirasawa et al. | 357/51 |
| 4,276,095 | 6/1981 | Beilstein, Jr. et al. | 357/23.12 |
| 4,830,974 | 5/1989 | Chang et al. | 357/23.5 |
| 4,851,361 | 7/1989 | Schumann et al. | 357/23.5 |
| 4,859,619 | 8/1989 | Wu et al. | 357/23.5 |

FOREIGN PATENT DOCUMENTS 58-050771  3/1983  Japan ................. 357/23.5

Primary Examiner—Jerome Jackson, Jr.
Attorney, Agent, or Firm—Rosen, Dainow & Jacobs

[57] ABSTRACT

A contact chain structure, for troubleshooting integrated circuits of EPROM memories, of a type comprising cluster contacts connecting metallization layers to active areas of the circuit, comprises a source-drain region implanted centrally of each active area. Deposited over that region is a gate region which, on being biased, enables the conductive condition of the chain to be varied.

10 Claims, 1 Drawing Sheet

CONTACT CHAIN STRUCTURE FOR TROUBLESHOOTING EPROM MEMORY CIRCUITS

This application is a continuation Ser. No. 07/454,140, filed Dec. 21, 1989, now abandoned.

This invention relates to a contact chain structure for troubleshooting EPROM memory circuits, being of a type which comprises contact chains connecting metallization layers to active areas of the circuit.

The invention is also concerned with a method of manufacturing integrated circuits incorporating the above-mentioned contact structure.

BACKGROUND OF INVENTION

As is well known, a growing trend in the manufacture of semiconductor integrated circuits is toward integration on a large and very large scale.

This involves increased technological commitment to produce circuit devices which can incorporate on a single chip a very large number (on the order of one million) of individual active components.

In such an application, there exists an evident demand for quality control and statistical analysis techniques which can result in readier identification of manufacturing process steps of specially critical value in the production of faultless circuits. All this in order to better aim the investigative effort at such critical process aspects, whenever required.

A prior technique directed to fill this demand has been the provision of test contact structures nested in the integrated circuit and adapted to be analysed electrically for quality control purposes. Such structures are specially suitable to pick up faults that have occurred during the contact opening process itself.

In essence, it is a matter for providing a long chain of contacts which alternately interconnect surface metallization layers and active areas of the circuit.

If the chain ends are biased electrically, a missed connection, for example, can be readily located by measuring the value of the current flowing through the structure.

A drastic decrease of the design value for that current would reveal a break in the chain of contacts.

However, this prior approach is ill adapted to implementation within integrated memory circuits, and especially within cells of the EPROM type, and in any case does not match the topography of such memories.

Such memory cells have, in fact, a special topography that would disallow formation of the above-noted contact chains unless some steps of the manufacturing process are changed to suit. This runs contrary, therefore, to the very objectives of such test contact structures, which are expected to enable troubleshooting of the customary steps of the process.

SUMMARY OF INVENTION

The technical problem that underlies this invention is to provide a test contact chain structure having such constructional and performance characteristics as to enable troubleshooting of EPROM memory circuits with none of the cited shortcomings with which the prior art is beset.

This problem is solved by a structure as indicated being characterized in that it comprises a source-drain region implanted centrally of each active area, said contacts being connected to said areas at said region.

The invention is also concerned with a method of making integrated circuits which incorporate test contact chains between metallization layers and active areas defined over a semiconductor substrate, for troubleshooting said circuits, characterized in that it comprises a step of implanting a source-drain region defined centrally of each active area, said step preceding a step of depositing gate regions over the active areas.

The features and advantages of the contact structure according to the invention will become apparent from the following detailed description of an embodiment thereof, given by way of illustration and not of limitation with reference to the accompanying drawing.

DETAILED DESCRIPTION OF PREFERRED EMBODIMENT

Figure 1:
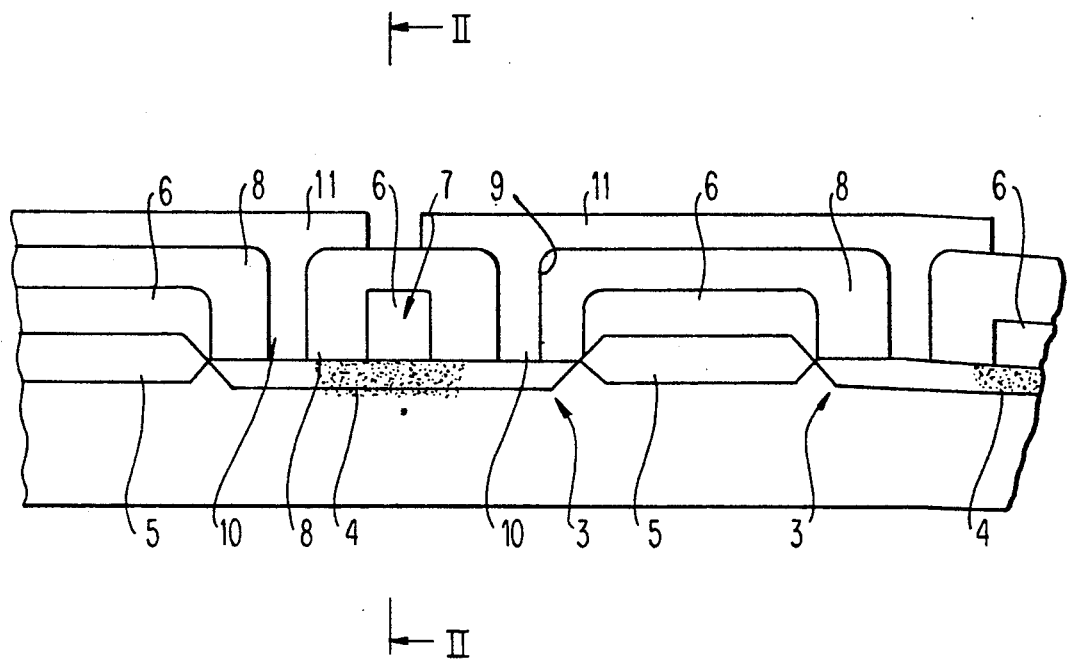
FIG. 1 is a sectional side view showing schematically a test contact structure according to the invention.

With reference to the drawing figures, schematically indicated at 1 is an integrated circuit test structure, e.g. for testing EPROM memories which are usually made at the same time. That circuit 1 is a CMOS technology construction and comprises regular clusters of devices formed on a monocrystalline silicon substrate 2 over which active areas 3 are defined.

The active areas 3 are bound laterally by so-called field oxide regions 5.

Advantageously, according to the method of this invention, there are implanted, centrally of each active area 3, source and drain regions 4 by a conventional masking process. This means that the regions 4 are made in these test structures under the same conditions that the source and drain regions of the active devices (not shown) are implanted. By "centrally" is meant that the implanted dopants are located within the substrate regions bounded by the field oxide regions 5, generally centrally of the active areas 3.

Figure 2:
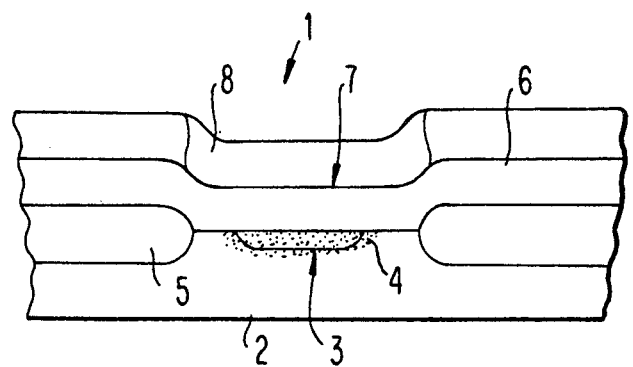
FIG. 2 is a schematic sectional view taken through the structure of FIG. 1 along the line II—II.

As shown in FIG. 2, the implantation region 4 occupies a larger surface area than the central portion of the active area 3 in which it is formed, and extends partway into the substrate 2.

Deposited over the active areas 3 is a layer 6 of polycrystalline silicon adapted to form the floating gates 7 of the EPROM memories.

By subsequent appropriate masking, that layer 6 is removed along the sides of the gate regions 7 and the field oxide regions 5.

At this time, a dielectric layer 8 of silicon dioxide is deposited which is then apertured as at 9 for accommodating respective contacts 10 whose depth extends to reach the active areas 3.

A plurality of interconnecting metal layers 11 are deposited onto the layer 8 surface. Such layers 11 are interrupted at the gates 7, above the latter, and connect the various contacts 10 together substantially into a chain structure of serially connected contacts through the active areas 3.

Advantageously according to the invention, respective contacts 10 are formed on opposite sides from each gate 7, and each contact connects, on the one side, an end portion of a layer 11, and the active area 3 beside the gate 7, on the other side.

The contact chain structure 10 so arranged also includes the region 4 and gate 7 itself, by virtue of that pairs of contacts 10 not separated by field oxide regions 5 are connected electrically through the active area 3 and the region 4.

In other words, contrary to prior art structures, the test structure of this invention also enables the drain and source regions 4 to be hooked to the contact chain, along with the gate regions 7.

The enlargement of the region 4 shown in FIG. 2 is directed to lower the resistance of each individual element in the chain.

In essence, the test contact chain structure according to the invention is obtained through the EPROM technology and enables circuits incorporating it to be troubleshot for faults arising from manufacturing steps in progress at the time. This is made possible by that the source-drain region is formed ahead of forming the gate region, thereby the implanted regions can be hooked to the contact chain while the manufacturing process is still being developed.

I claim:

1. A test contact chain structure for testing the processing of semiconductor devices of the EPROM memory type having implanted source-drain regions and a gate electrode, comprising:
    (a) a semiconductor substrate having a plurality of spaced active areas,
    (b) implanted regions each located generally in the center of each of the said active areas, said implanted regions having been made in substantially the same manner as the sourcedrain regions of the devices whose manufacture is to be tested,
    (c) a conductive interconnect layer over the substrate,
    (d) plural contacts to spaced points of each active area interconnected by the conductive interconnect layer such that a contact chain is formed serially interconnecting the active areas and including the implanted regions, said implanted regions each lying between the spaced contacts.

2. A test contact chain structure as claimed in claim 1, further comprising a conductive member contacting the surface of each active area at the implanted region, said conductive member having been made in substantially the same manner as the gate electrode of the devices whose manufacture is to be tested.

3. A test contact chain structure as claimed in claim 2, wherein the conductive member is of polycrystalline silicon.

4. A test contact chain structure as claimed in claim 3, wherein the plural contacts bracket the conductive member.

5. A test contact chain structure as claimed in claim 2, wherein the implanted regions overlap laterally each active area boundaries and penetrate deeper into the substrate than that of each active area.

6. A contact chain structure for troubleshooting of semiconductor devices of the EPROM memory type having implanted source-drain regions and a gate electrode, comprising:
    (a) a semiconductor substrate having a plurality of spaced active areas,
    (b) implanted regions each located generally in the center of all of the said active areas, said implanted regions having the same dopant content as the source-drain regions of the EPROM devices,
    (c) a conductive interconnect layer over the substrate,
    (d) plural contacts to spaced points of each active area interconnected by the conductive interconnect layer such that a contact chain is formed serially interconnecting the active areas and including the implanted regions, said implanted regions each lying between the spaced contacts.

7. A contact chain structure as claimed in claim 6, further comprising a conductive member contacting the surface of each active area at the implanted region, said conductive member having been made in substantially the same manner as the gate electrode of the EPROM devices.

8. A contact chain structure as claimed in claim 7, wherein the conductive member is of polycrystalline silicon.

9. A contact chain structure as claimed in claim 8, wherein the plural contacts bracket the conductive member.

10. A contact chain structure as claimed in claim 7, wherein the implanted regions overlap laterally each active area boundaries and penetrate deeper into the substrate than that of each active area.

* * * * *